United States Patent
Goldberg et al.

(10) Patent No.: US 9,917,599 B2
(45) Date of Patent: Mar. 13, 2018

(54) CODING SCHEMES INCLUDING ALTERNATIVE CODINGS FOR A SINGLE CODE CONSTRUCT

(71) Applicant: International Business Machines Corporation, Armonk, NY (US)

(72) Inventors: Itzhack Goldberg, Hadera (IL); Erik Rueger, Ockenheim (DE); Lance W. Russell, Rosanky, TX (US); Neil Sondhi, Budapest (HU)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/830,055

(22) Filed: Aug. 19, 2015

(65) Prior Publication Data
US 2017/0054455 A1    Feb. 23, 2017

(51) Int. Cl.
*H03M 13/00* (2006.01)
*H03M 13/03* (2006.01)

(52) U.S. Cl.
CPC .................................. *H03M 13/03* (2013.01)

(58) Field of Classification Search
CPC ........................ H03M 13/2906; H03M 13/39
See application file for complete search history.

(56) References Cited

U.S. PATENT DOCUMENTS

| | | | |
|---|---|---|---|
| 5,907,671 A * | 5/1999 | Chen .................... | G06F 11/183 714/6.24 |
| 6,829,620 B2 | 12/2004 | Hsing et al. | |
| 7,617,422 B2 | 11/2009 | Stern et al. | |
| 8,180,744 B2 | 5/2012 | Deolalikar et al. | |
| 8,452,733 B2 | 5/2013 | Chan et al. | |
| 2005/0125749 A1 * | 6/2005 | Goodnow ........... | G06F 17/5045 716/103 |
| 2011/0252475 A1 | 10/2011 | Mui et al. | |
| 2012/0142333 A1 * | 6/2012 | Kasturi ................. | H04L 12/66 455/422.1 |
| 2014/0061320 A1 | 3/2014 | Guenter et al. | |
| 2015/0372693 A1 | 12/2015 | Shirguppi | |

OTHER PUBLICATIONS

Cohen et al., "A Method for Recovering Data From Failing Floppy Disk Drives", provided by inventor in Main Idea of Disclosure dated Sep. 10, 2014, 8 pages.
(Continued)

*Primary Examiner* — Sam Rizk
(74) *Attorney, Agent, or Firm* — Steven F. McDaniel; David B. Woycechowsky (57) ABSTRACT

A coding scheme for coding "code constructs" (for example, alphanumeric characters) into "bit sequences," where at least one of the code constructs is assigned at least two different bit sequences (that is, a first bit sequence and a second bit sequence). This is sometimes referred to herein as "alternative codings for a single code construct." In some embodiments, at least one of the alternative codings includes bits that can be used for error detection and/or correction. In some embodiments, the code scheme will be similar to a pre-existing code scheme that does not have alternative codings for a single code construct so that the alternative-codings coding scheme is back compatible with data encoded under the pre-existing coding scheme.

12 Claims, 2 Drawing Sheets

(56) References Cited

OTHER PUBLICATIONS

Rajesh, R.S. "Compuer Networks: Fundamentals & Applications, 1E", Vikas Publishing House Pvt Ltd, Oct. 1, 2002, p. 11.
White, Curt, "Data Communications and Computer Networks: A Business User's Approach", Cengage Learning, Jan. 1, 2015, p. 168.
"Digital Preservation Strategies", provided by inventor in Main Idea of Disclosure dated Sep. 10, 2014, 4 pages, <http://www.dpworkshop.org/dpm-eng/terminology/strategies.html>.
"Data degradation", Wikipedia, the free encyclopedia, page last modified on Apr. 2, 2015, at 17:50, 3 pages, <http://en.wikipedia.org/wiki/Data_degradation>.
"Hamming code", Wikipedia, the free encyclopedia, May 22, 2015 at 05:59, 10 pages, <https://en.wikipedia.org/w/index.php?title=Hamming_code&oldid=663503960>.
"Unicode", Wikipedia, the free encyclopedia, page last modified on Apr. 13, 2015, at 00:50, 27 pages, <http://en.wikipedia.org/wiki/Unicode>.
"UTF-8", Wikipedia, the free encyclopedia, Jun. 24, 2015 at 17:42, 18 pages, <https://en.wikipedia.org/w/index.php?title=UTF-8&oldid=668496220>.

\* cited by examiner

CODING SCHEMES INCLUDING ALTERNATIVE CODINGS FOR A SINGLE CODE CONSTRUCT

BACKGROUND

The present invention relates generally to the field of coding "constructs" as ordered binary bit sets, and more particularly to coding alphanumeric characters as ordered binary bit sets.

Many coding schemes used to make code for computers convert pieces of data into ordered binary bit sets (sometimes herein referred to as "bit sequences"). In this document, pieces of data susceptible to encoding as bit sequences will be referred to as "code constructs." Some examples of code constructs as follows: machine logic functions (for example, calculating an arithmetic mean), operators (for example, the union operator for dealing with sets), numbers, portions of image data (for example, pixel properties), portions of audio data, alphanumeric characters, computer operation functions (for example, SAVE), etc. When coded binary bit sequences are stored and/or transmitted they are typically subject to errors and/or data degradation. Different types of data degradation tend to have different degradation characteristics. For example, Hamming encoding is designed to help counter certain types of data degradation. As a further example, when binary data is stored on tape storage media, it tends to undergo "unidirectional bit rot," where binary one's may degrade into zero's, but binary zero's do not tend to degrade to one's.

A couple features of conventional binary coding will now be discussed in the following paragraphs.

First, references to ordering of binary bit sequences do not necessarily refer to the order in which the bits are transmitted through a transmission medium and/or stored on a storage medium. Rather, the ordering and/or sequence refers to the ordering and/or sequence used when code constructs are encoded into and/or decoded from binary bits. When machine logic stores and/or transmits the bits, the ordering can be changed for various reasons, so long as the ordering needed to decode the code constructs can be reconstructed from the transmitted and/or stored data.

Second, this document largely focuses on types of coding (sometimes herein referred to as code construct coding) where each discrete code construct is coded into a bit sequence. This is to be distinguished from types of coding, such as certain types of lossy data compression, where binary bit sequences representing multiple code constructs (for example, multiple alphanumeric characters) are further coded to represent a larger piece of data (for example, a book length piece of text).

Third, some code construct coding uses a fixed bit length for every bit sequence that represents a code construct. An example of fixed length code construct coding is ASCII (American standard code for information interchange) coding for alphanumeric characters, where each alphanumeric character is represented by a seven bit long bit sequence. Other code construct coding schemes assign different length bit sequences for different code constructs. An example of variable length code construct coding is Unicode16 coding for alphanumeric characteristics, where some alphanumeric characters (called singletons) are respectively represented by an eight bit long bit sequence, and other alphanumeric characters are respectively represented by longer assigned bit sequences. In this document, "code construct coding" collectively refers to both fixed length code construct coding and variable length code construct coding.

Fourth, some code construct coding schemes include unassigned bit sequences (sometimes herein referred to as "unassigned code-points"). As a simple example, assume a coding scheme where: (i) the only code constructs "codeable" into the code are alphanumeric characters "A," "B," and "C"; (ii) alphanumeric character "A" is represented by two bit length bit sequence 00; (iii) alphanumeric character "B" is represented by two bit length bit sequence 01; and (iv) alphanumeric character "C" is represented by two bit length bit sequence 10. In such an encoding scheme, the bit sequence 11 is an unassigned bit sequence. Unicode16 and Unicode32 are code construct (specifically, alphanumeric code construct) coding sequences which include unassigned bit sequences.

Fifth, in some code construct coding schemes (herein referred to as "redundant code construct coding schemes"), each assigned bit sequence includes redundant bits. Two examples of redundant code construct coding schemes will respectively be discussed in the following two paragraphs.

*Computer Networks: Fundamentals & Applications* by R. S. Rajesh, states as follows: "Error correcting codes . . . . Techniques covered so far deal with error detection only. When error-detecting techniques are used, and the receiver receives the data with error, the receiver discards the data and asks for retransmission. On the other hand, error-correcting codes are used to identify the error bits in the received data and correct them. The main problem with error-correcting codes is that they require more redundancy bits than the error-detecting codes. This leads to wastage of transmission bandwidth. Single-bit error correction . . . . The key issue in error-correction is to identify the position of [an] invalid error bit, in order to correct it. For example, when 7-bit ASCII code is transmitted, the error-correcting code must identify the position of the bit that contains an error. Hence, at least three redundant bits are used to identify the possibility of error in the seven positions in an ASCII character. However, if an error occurs at the redundant bits themselves, to identify it, additional bits are required. Hence the total number of bits in the transmitted data contain m+k bits. M is the number of message bits and K is the number of redundant bits. The calculation of the total number of redundant bits for single bit error correction is straightforward. One bit is used for ensuring that the received data is error-free. Other bits are used to indicate one out of M message and K redundant bits that may contain an error. Hence, the value of K must be chosen such that $2^K \geq M+K+1$. For example to correct [a] single bit error in 7-bit ASCII code, at least 4 redundant bits are needed. Hence, the transmitted data contains 11 bits for each data units [sic]."

*Data Communications and Computer Networks: A Business User's Approach* by Curt White (8th Edition) states as follows: "For a data code such as ASCII to perform forward error correction, redundant bits must be added to the original data bits. These redundant bits allow a receiver to look at the received data and, if there is an error, recover the original data using a consensus of the received bits . . . . For a simple example, . . . transmit three identical copies of a single bit (majority operation). Thus, to send a 1, 111 will be transmitted. Next consider what would happen if the three bits received have the values 101. In forward error correction, the receiver would assume that the 0 bit should be a 1 because the majority of bits are 1."

SUMMARY

According to an aspect of the present invention, there is a method, computer program product and/or system that performs the following operations (not necessarily in the following order): (i) receiving a plurality of code constructs including a first code construct; (ii) defining a plurality of bit sequences, including a first bit sequence and a second bit sequence, with each bit sequence of the plurality of bit sequences being respectively constituted by an ordered plurality of binary bit values where the number of binary bit values in a given bit sequence is the bit length of the given bit sequence; and (iii) making a machine logic set to implement a first coding scheme for respectively representing each of the plurality of code constructs by at least one bit sequence of the plurality of bit sequences, so that under the first coding scheme the first code construct can be alternatively represented by either of the first bit sequence or the second bit sequence.

According to a further aspect of the present invention, there is a method, computer program product and/or system that performs the following operations (not necessarily in the following order): (i) providing a machine logic set that implements a first coding scheme where (a) each code construct of a plurality of code constructs, including a first code construct, is respectively represented by at least one bit sequence of a plurality of bit sequences, including a first bit sequence and a second bit sequence, (b) each bit sequence of the plurality of bit sequences is respectively constituted by an ordered plurality of binary bit values where the number of binary bit values in a given bit sequence is the bit length of the given bit sequence, and (c) the first code construct can be alternatively represented by either of the first bit sequence or the second bit sequence; (ii) receiving an encodable data set made up of code construct instances including a first instance of a first code construct; and (iii) encoding, by the machine logic set, the encodable data set to yield an encoded data set which is encoded according to the first coding scheme.

According to a further aspect of the present invention, there is a method, computer program product and/or system that performs the following operations (not necessarily in the following order): (i) providing a machine logic set that implements a first coding scheme where (a) each code construct of a plurality of code constructs, including a first code construct, is respectively represented by at least one bit sequence of a plurality of bit sequences, including a first bit sequence and a second bit sequence, (b) each bit sequence of the plurality of bit sequences is respectively constituted by an ordered plurality of binary bit values where the number of binary bit values in a given bit sequence is the bit length of the given bit sequence, and (c) the first code construct can be alternatively represented by either of the first bit sequence or the second bit sequence; (ii) receiving a decodable data set made up of bit sequence instances; and (iii) decoding, by the machine logic set, the decodable data set to yield a decoded data set which is encoded according to the first coding scheme so that (a) each instance of the first bit sequence is decoded as an instance of the first code construct, and (b) each instance of the second bit sequence is decoded as an instance of the first code construct.

DETAILED DESCRIPTION

Some embodiments of the present disclosure are directed to a coding scheme for coding "code constructs" (for example, alphanumeric characters) into "bit sequences," where at least one of the code constructs is assigned at least two different bit sequences (that is, a first bit sequence and a second bit sequence). This is sometimes referred to herein as "alternative codings for a single code construct." In some embodiments, at least one of the first and second bit sequences includes bits that can be used for error detection and/or correction. In some embodiments, the code scheme will be similar to a pre-existing code scheme that does not have alternative codings for a single code construct. In some of these embodiments, the new coding scheme, according to the present disclosure, uses unassigned bit sequences in the pre-existing code scheme to accommodate at least some of the alternative codings to provide back compatibility with respect to code encoded under the pre-existing coding scheme.

In some embodiments of the present disclosure: (i) some code constructs are defined by a single unique bit sequence; and (ii) other constructs of the code have multiple bit sequences allocated to them, where each bit sequence of the multiple bit sequence uniquely defines the construct. It is noted that a "bit sequence" does not necessarily refer to the sequence as the bits of the code are stored, or transmitted, but, rather, the sequences used in encoding and decoding code constructs to and from binary code. Some embodiments of the present disclosure eschew a conventional paradigm where either: (i) all code constructs in a coding scheme get error checking bits; or else (ii) no code constructs in the scheme get error checking bits.

This Detailed Description section is divided into the following sub-sections: (i) The Hardware and Software Environment; (ii) Example Embodiment; (iii) Further Comments and/or Embodiments; and (iv) Definitions.

I. The Hardware and Software Environment

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 1:
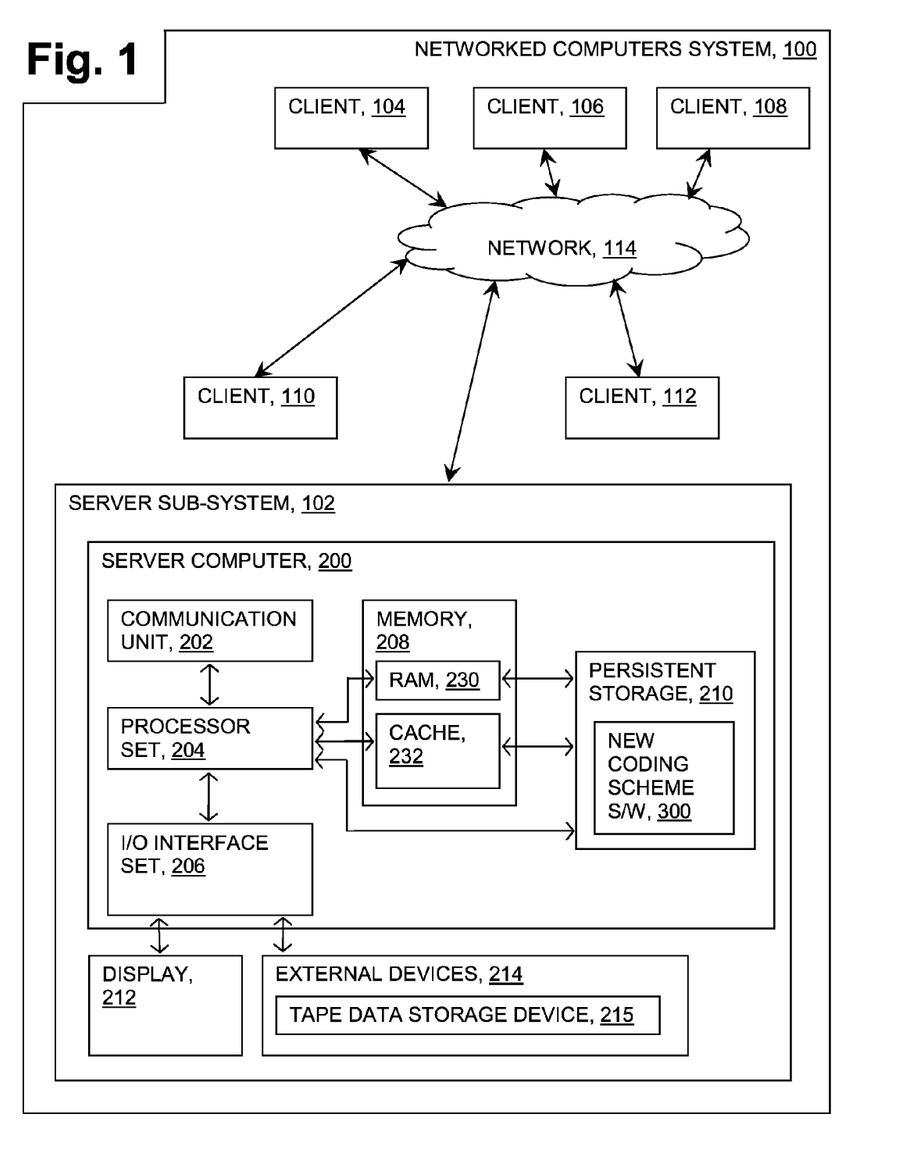
FIG. 1 is a block diagram view of a first embodiment of a system according to the present invention.

An embodiment of a possible hardware and software environment for software and/or methods according to the present invention will now be described in detail with reference to the Figures. FIG. 1 is a functional block diagram illustrating various portions of networked computers system 100, including: server sub-system 102; clients 104, 106, 108, 110, and 112; communication network 114; server computer 200; communication unit 202; processor set 204; input/output (I/O) interface set 206; memory device 208; persistent storage device 210; display device 212; external device set 214; tape data storage device 215; random access memory (RAM) devices 230; cache memory device 232; and new coding scheme software 300.

Sub-system 102 is, in many respects, representative of the various computer sub-system(s) in the present invention. Accordingly, several portions of sub-system 102 will now be discussed in the following paragraphs.

Sub-system 102 may be a laptop computer, tablet computer, netbook computer, personal computer (PC), a desktop computer, a personal digital assistant (PDA), a smart phone, or any programmable electronic device capable of communicating with the client sub-systems via network 114. New coding scheme software 300 is a collection of machine readable instructions and/or data that is used to create, manage and control certain software functions that will be discussed in detail, below, in the Example Embodiment sub-section of this Detailed Description section.

Sub-system 102 is capable of communicating with other computer sub-systems via network 114. Network 114 can be, for example, a local area network (LAN), a wide area network (WAN) such as the Internet, or a combination of the two, and can include wired, wireless, or fiber optic connections. In general, network 114 can be any combination of connections and protocols that will support communications between server and client sub-systems.

Sub-system 102 is shown as a block diagram with many double arrows. These double arrows (no separate reference numerals) represent a communications fabric, which provides communications between various components of sub-system 102. This communications fabric can be implemented with any architecture designed for passing data and/or control information between processors (such as microprocessors, communications and network processors, etc.), system memory, peripheral devices, and any other hardware components within a system. For example, the communications fabric can be implemented, at least in part, with one or more buses.

Memory 208 and persistent storage 210 are computer-readable storage media. In general, memory 208 can include any suitable volatile or non-volatile computer-readable storage media. It is further noted that, now and/or in the near future: (i) external device(s) 214 may be able to supply, some or all, memory for sub-system 102; and/or (ii) devices external to sub-system 102 may be able to provide memory for sub-system 102.

New coding scheme software 300 is stored in persistent storage 210 for access and/or execution by one or more of the respective computer processors 204, usually through one or more memories of memory 208. Persistent storage 210: (i) is at least more persistent than a signal in transit; (ii) stores the program (including its soft logic and/or data), on a tangible medium (such as magnetic or optical domains); and (iii) is substantially less persistent than permanent storage. Alternatively, data storage may be more persistent and/or permanent than the type of storage provided by persistent storage 210.

New coding scheme software 300 may include both machine readable and performable instructions and/or substantive data (that is, the type of data stored in a database). In this particular embodiment, persistent storage 210 includes a magnetic hard disk drive. To name some possible variations, persistent storage 210 may include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 210 may also be removable. For example, a removable hard drive may be used for persistent storage 210. Other examples include optical and magnetic disks, thumb drives, and smart cards that are inserted into a drive for transfer onto another computer-readable storage medium that is also part of persistent storage 210.

Communications unit 202, in these examples, provides for communications with other data processing systems or devices external to sub-system 102. In these examples, communications unit 202 includes one or more network interface cards. Communications unit 202 may provide communications through the use of either or both physical and wireless communications links. Any software modules discussed herein may be downloaded to a persistent storage device (such as persistent storage device 210) through a communications unit (such as communications unit 202).

I/O interface set 206 allows for input and output of data with other devices that may be connected locally in data communication with server computer 200. For example, I/O interface set 206 provides a connection to external device set 214. External device set 214 will typically include devices such as a keyboard, keypad, a touch screen, and/or some other suitable input device. External device set 214 can also include portable computer-readable storage media such as, for example, thumb drives, portable optical or magnetic disks, and memory cards. Software and data used to practice embodiments of the present invention, for example, new coding scheme software 300, can be stored on such portable computer-readable storage media. In these embodiments the relevant software may (or may not) be loaded, in whole or in part, onto persistent storage device 210 via I/O interface set 206. I/O interface set 206 also connects in data communication with display device 212.

Display device 212 provides a mechanism to display data to a user and may be, for example, a computer monitor or a smart phone display screen.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

II. Example Embodiment

Figure 2:
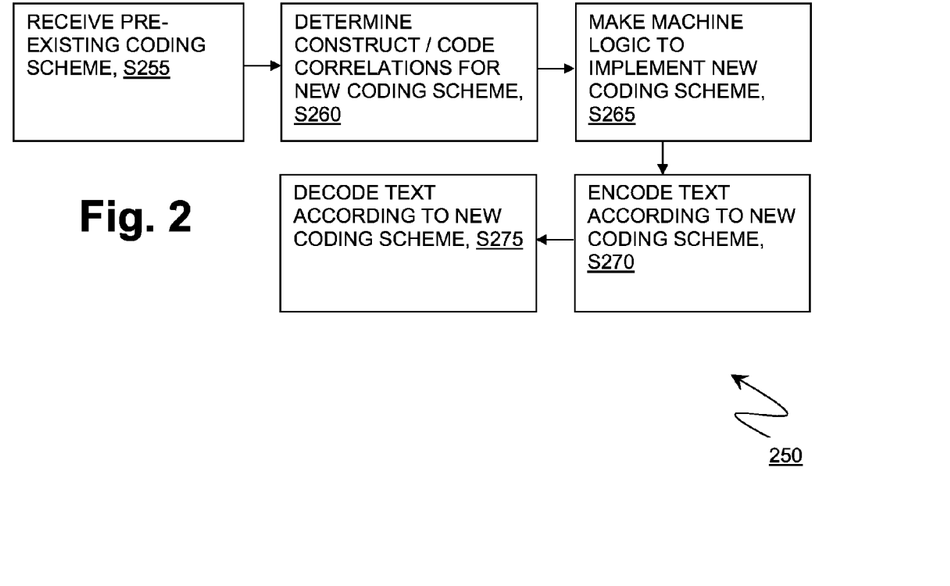
FIG. 2 is a flowchart showing a first embodiment method performed, at least in part, by the first embodiment system.
Figure 3:
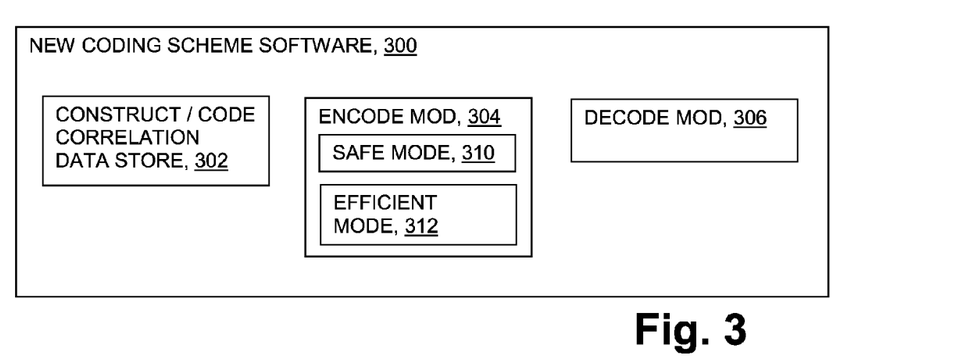
FIG. 3 is a block diagram showing a machine logic (for example, software) portion of the first embodiment system.

FIG. 2 shows flowchart 250 depicting a method according to the present invention. FIG. 3 shows new coding scheme software 300 for performing at least some of the method operations of flowchart 250. This method and associated software will now be discussed, over the course of the following paragraphs, with extensive reference to FIG. 2 (for the method operation blocks) and FIG. 3 (for the software blocks).

Processing begins at operation S255, where a predefined coding scheme, is received by a software designer. In this embodiment, the predefined coding scheme is a coding scheme where the code constructs take the form of an alphanumeric character set (see definition of alphanumeric character set, below), and, furthermore, in this embodiment, the predefined alphanumeric coding scheme is a Unicode coding scheme. In this embodiment, the recipient of the predefined coding scheme is a human. Alternatively, the recipient of the coding scheme could be a machine logic based entity, such as a software program or artificial intelligence engine.

Processing proceeds to operation S260, where, in this embodiment, the software designer (not shown in the Figures) determines a new coding scheme that includes multiple bit sequences assigned to at least some of its code constructs.

More specifically, in this embodiment, the software designer determines the new coding scheme (based in part upon the predefined coding scheme received at operation S255) to have the following features and/or characteristics: (i) at least some code constructs (in this embodiment, alphanumeric characters) will have multiple bit sequences assigned to them by the software designer; (ii) the bit sequence assignments of the predefined coding scheme will also be substantially (or completely) used in the new coding scheme being developed in operation S260; (iii) the predefined coding scheme includes unassigned bit sequences, which are used in the new coding scheme for alternative assignments for code constructs that already have a bit sequence assignment in the new coding scheme (for example, code constructs that have a first bit sequence assignment in the predefined coding scheme and are now being assigned alternative bit sequence(s) by the software designer; (iv) some code constructs have assigned to them both of a bit sequence that provides for error detection and another bit sequence that does not provide for error detection; and/or (v) some code constructs have assigned to them both of a bit sequence that provides for error correction and another bit sequence that does not provide for error correction.

In this embodiment, the designer chooses some alphanumeric characters to respectively have two different codings as follows: (i) the bit sequence that the alphanumeric character had in the predefined coding scheme (that is, the Unicode scheme); and (ii) an additional, different bit sequence that includes sufficient bits to allow for redundant bit type error correction, where the additional bit sequence is an unassigned sequence (unassigned code-point) in the predefined Unicode coding scheme. More specifically with respect to the redundant bit type error correction, in this embodiment, the redundant bit error correction is accomplished by repeating the Unicode bit sequence three times in an interleaved fashion (for example, a Unicode bit sequence of 1010 would become 111000111000). This type of redundant bit error correction is called repetition error correction because all bits of a base bit sequence are repeated (or repeated as inverse value). Alternatively and/or additionally, there are many other possible error correction and/or detection protocols (now known or to be developed in the future) such as: parity, checksums, CRCs (cyclic redundancy checks), cryptographic hash functions, convolutional codes, block codes (for example, Hamming codes), linear error correcting codes and/or nonlinear error correcting codes.

Processing proceeds to operation S265 where a machine logic representation of the new coding scheme of operation S260 is made. In this embodiment, the coding scheme is stored as a look-up table called construct/code data store 302. In other embodiments, the machine language implementation may be less soft (for example, provided as firmware to a processor, hard coded into a processor).

Processing proceeds to operation S270 where encode module 304 of new coding scheme software 300 encodes a text string according to the new coding scheme (using construct/code correlation data store 302) under one of the following modes: (i) safe mode which is encoded by safe mode sub-mod 310; or (ii) efficient mode which is encoded by efficient mode sub-mod 312. Under efficient mode, when an alphanumeric character being encoded has multiple encodings, the basic Unicode encoding (with no error correction and/or detection) is used in the text as encoded. This saves space, and allows decoding with a standard Unicode decoder at a later time. Under safe mode, when an alphanumeric character being encoded has multiple encodings, an alternative encoding with error correction and/or detection is used in the text as encoded. This may require more storage space. At operation S270, the encoded text is stored to tape storage device 215. Error correction in connection with data stored on tape will be further discussed, below, in the Further Comments And/Or Embodiments sub-section of the Detailed Description section.

Processing proceeds to operation S275 where decode module 306 of new coding scheme software 300 decodes a text string according to the new coding scheme (using construct/code correlation data store 302). The machine logic of mod 306 allows reliable decoding, even of alphanumeric characters that have multiple codings. Furthermore, when the coding chosen for a given alphanumeric character of the string provides for error correction and/or detection, then mod 306 provides error correction and/or detection for that character.

III. Further Comments and/or Embodiments

Some embodiments of the present invention may include one, or more, of the following features, characteristics and/or advantages: (i) retains data integrity by tolerating partial textual data decay; (ii) introduces new Unicode formatting; (iii) modifies or adapts the Unicode standard to address issues of data degradation within a storage environment; (iv) stores 2 or 4 instances of each character; (v) maps multiple bit patterns to a given character (as opposed to typical one-pattern manifestations); and/or (vi) retains data integrity if one bit decays.

A weak bit is a bit which has decayed such that it is not possible to ascertain whether the bit represents a "1" or a "0". Some embodiments of the present invention make use of a known phenomenon, referred to as a unidirectional decay phenomenon: (i) in some storage media, a weak bit "1" can decay into a "0" (thus "1" is a decayable logical bit value) but a weak bit "0" cannot decay into a "1"; (ii) in some storage media, a weak bit "0" can decay into "1" (thus "0" is a decayable logical bit value) but a weak bit "1" cannot decay into a "0". A unidirectional decay phenomenon is contrasted with a bidirectional decay phenomenon wherein a weak bit value, whether "0" or "1", can decay into its opposite value, "1" or "0", respectively.

Some embodiments of the present invention improve data robustness, such that it can withstand, at least to a certain level, incidents of data decay resulting from weak bits.

Some embodiments of the present invention introduce a new Unicode character encoding designed to withstand data rot. A group of 16 or 32 bits is used respectively to store 2 or 4 instances of a character. If a partial decay occurs, it remains possible to recognize the original data. In general, each character has multiple patterns mapped to it, instead of having a single pattern manifestation as we have today. Hence, if one bit decays, the integrity of the data is retained. For example, an ASCII (American standard code for information interchange) character is encoded such that each logical bit is represented by two physical bits. Thus, if one bit decays, there remains the other bit to indicate the original nature of the data.

The following examples illustrate the concept brought forth by some embodiments of the present invention. (The standard binary encoding of ASCII character "A" is "0100 0001".) Using a "double physical bits per one logical bit" technique, the character "A" is encoded as: "0011 0000 0000 0011". If one of the "1"s decays into "0" the other "1" next to it (the respective replicate) remains, to indicate that the character is in fact "A" and not another character. Note here that for some media types, a "1" can decay into a "0", but not vice versa, whereas for other media types, a "0" can decay into a "1" but not vice versa. Examples of media types include magnetic disks, magnetic tape, flash drives, solid state drives, optical disks, etc.

Some embodiments of the present invention make use of an encoding method as follows: each character is encoded twice in succession in a bit pattern longer than the original bit pattern. For example, if the character "A", has an 8-bit pattern "0100 0001" (hex "41") in some encoding schemes, it is redundantly represented with the 16-bit pattern "0100 0001 0100 0001" (hex "4141") in some embodiments of the present invention.

In some embodiments of the present invention, for media types for which the direction of data decay is known, it is a simple matter to determine what an original character is when some of its bits have decayed.

Further, some embodiments of the present invention use more sophisticated patterns. The nature of the pattern(s) used is not exhaustively disclosed herein, nor limited to the examples given herein.

For textual mission critical data, degradation cannot be accepted. Techniques used in some embodiments of the present invention effectively eliminate degradation issues. In some situations, the burden of decreased data storage capacity on a physical storage medium (due to, for example, doubling or quadrupling the volume of the data being stored), is significantly outweighed by the benefit of improved data integrity over long term storage.

Some conventional systems are concerned with the hardware space. When they "look" at a group of bits, they focus on a voltage level to determine whether the group of bits, as a whole, reflects a value of "1" or "0" based, on a predetermined threshold.

In contrast, some embodiments of the present invention address the problem at a higher level, that is, after a given bit value, has been established. It is known that some bit voltages can be diminished over time. Yet it is also known that voltage decays in a downward direction only, so a bit can turn from "0" to "1" (or "1" to "0" depending on the media type) and not the other way around. For example, on a medium where "0" to "1" is the decay direction, and a pair of corresponding bits do not agree, then "0" is the correct bit and "1" is the decayed bit.

In some conventional systems, for example a "RAID" (redundant array of independent disks) system, a plurality of copies of the data is kept on a plurality of devices. In contrast, some embodiments of the present invention reuse extra space available in a larger bit-pattern format to store redundant copies of a shorter bit-pattern character, thereby keeping the redundancy within the original/first copy itself, such that no reference is required outside of the initial read.

Some embodiments of the present invention use redundancy within the original data, not outside of it, thereby more quickly resolving suspected data decay (with a single read cycle), and not having to read from a different location, medium and/or device. The extended ASCII space is reused so as to embed two or more copies of a given character.

Some conventional systems store multiple copies of bit patterns in "high reliability" cells. The physical values of the redundant bits are read to arrive at an average physical value for all the redundant bits. A single logical value represented by the redundant bits is then resolved, based on their average physical value.

In contrast, some embodiments of the present invention, having already determined the logical values of individual bits stored within a Unicode character, compare the logical values of corresponding respective redundant bits, as illustrated with the following simple example. Assume an 8-bit ASCII character is stored twice within a 16-bit Unicode character. Each of the 8-bits of the ASCII character is represented by a pair of corresponding redundant bits. If upon reading, a pair of corresponding redundant bits (which when written, were identical) do not agree as to logical value, some embodiments of the present invention, knowing that a bit can decay in one direction only and not vice versa, can then determine which of the pair of corresponding redundant bits represents the correct logical value.

Some embodiments of the present invention may include one, or more, of the following features, characteristics and/or advantages: (i) stores redundant copies of a character that has a smaller bit count, within a character space having a larger bit count (for example, replicating an 8 bit character in a 16 bit, 32 bit, or 64 bit character format); (ii) stores each bit of a character two or more times within the format of a single character; (iii) if, upon having been read, respective copies of a redundant bit do not agree (that is, the redundant bits do not have the same binary value), determines which copy is correct (has not decayed) based on knowledge of the direction of decay for the media type from which the read operation was performed; (iv) keeps bit redundancy within the original copy; (v) does not require reference outside the initial read to resolve suspected data decay; (vi) resolves suspected data decay with reference to a single read operation; (vii) processes suspected data decay quickly; and/or (viii) allows for much faster recovery in case of a data decay, without resorting to an external media; (ix) recovers from data decay within a production input/output (I/O) stream instead of resorting to a disruptive recovery procedure.

IV. Definitions

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

Including/include/includes: unless otherwise explicitly noted, means "including but not necessarily limited to."

Module/Sub-Module: any set of hardware, firmware and/or software that operatively works to do some kind of function, without regard to whether the module is: (i) in a single local proximity; (ii) distributed over a wide area; (iii) in a single proximity within a larger piece of software code; (iv) located within a single piece of software code; (v) located in a single storage device, memory or medium; (vi) mechanically connected; (vii) electrically connected; and/or (viii) connected in data communication.

Computer: any device with significant data processing and/or machine readable instruction reading capabilities including, but not limited to: desktop computers, mainframe computers, laptop computers, field-programmable gate array (FPGA) based devices, smart phones, personal digital assistants (PDAs), body-mounted or inserted computers, embedded device style computers, application-specific integrated circuit (ASIC) based devices Alphanumeric character/alphanumeric character set: a conventional alphanumeric character, or any other type of action or entity that is typically included in alphanumeric character set coding scheme (for example, code for a page break, code to sound a beep).

What is claimed is:

1. A method comprising:
receiving an original American Standard Code for Information Interchange (ASCII) character;
producing a proxy character comprising at least two duplicates of the original ASCII character, including a first duplicate ASCII character and a second duplicate ASCII character, where the first duplicate ASCII character and the second duplicate ASCII character are each based on the original ASCII character;
storing the proxy character on a data storage medium wherein the data storage medium has a decayable bit logical value where the decayable bit logical value may decay to another logical value over time;
receiving, from a user, a request to retrieve the original ASCII character;
in response to receiving the request to retrieve the original ASCII character:
producing a new ASCII character,
retrieving the proxy character from the data storage medium,
comparing, bitwise, the first duplicate ASCII character with the second duplicate ASCII character,
on condition a logical value of any bit position of the first duplicate ASCII character is not equal to the logical value of a corresponding bit position of the second duplicate ASCII character, assigning the decayable bit logical value to the corresponding bit position of the new ASCII character,
on condition a logical value of any bit position of the first duplicate ASCII character has a common logical value with a corresponding bit position of the second duplicate ASCII character, assigning the common logical value to the corresponding bit position of the new ASCII character; and
returning the new ASCII character to the user.

2. The method of claim 1, wherein the proxy character is formulated to fall in an unassigned code point of a Unicode computing industry encoding standard.

3. The method of claim 1, wherein:
the original ASCII character does not provide for any error detection and/or error correction; and
the proxy character uniquely identifies the original ASCII character and also provides for at least some error detection and/or error correction.

4. The method of claim 1, wherein the data storage medium is one of the following types of data storage media:
magnetic disk;
magnetic tape;
flash drive;
solid state drive; and
optical disk.

5. A computer program product comprising:
at least one computer readable storage medium that is not a transitory signal per se, and program instructions stored on the at least one computer readable storage medium, the program instructions comprising instructions to perform:
receiving an original American Standard Code for Information Interchange (ASCII) character;
producing a proxy character comprising at least two duplicates of the original ASCII character, including a first duplicate ASCII character and a second duplicate ASCII character, where the first duplicate ASCII character and the second duplicate ASCII character are each based on the original ASCII character;
storing the proxy character on a data storage medium wherein the data storage medium has a decayable bit logical value where the decayable bit logical value may decay to another logical value over time;
receiving, from a user, a request to retrieve the original ASCII character;
in response to receiving the request to retrieve the original ASCII character:
producing a new ASCII character,
retrieving the proxy character from the data storage medium,
comparing, bitwise, the first duplicate ASCII character with the second duplicate ASCII character,
on condition a logical value of any hit position of the first duplicate ASCII character is not equal to the logical value of a corresponding bit position of the second duplicate ASCII character, assigning the decayable bit logical value to the corresponding bit position of the new ASCII character,
on condition a logical value of any bit position of the first duplicate ASCII character has a common logical value with a corresponding bit position of the second duplicate ASCII character, assigning the common logical value to the corresponding bit position of the new ASCII character; and
returning the new ASCII character to the user.

6. The computer program product of claim 5, wherein the proxy character is formulated to fall in an unassigned code point of a Unicode computing industry encoding standard.

7. The computer program product of claim 5, wherein:
the original ASCII character does not provide for any error detection and/or error correction; and
the proxy character uniquely identifies the original ASCII character and also provides for at least some error detection and/or error correction.

8. The computer program product of claim 5, wherein the data storage medium is one of the following types of data storage media:
magnetic disk;
magnetic tape;
flash drive;
solid state drive; and
optical disk.

9. A computer system comprising:
one or more computer processors;
at least one computer-readable storage medium that is not a transitory signal per se;
program instructions stored on the at least one computer-readable storage medium for execution by at least one of the one or more processors, the program instructions comprising instructions to perform:
receiving an original American Standard Code for Information Interchange (ASCII) character;
producing a proxy character comprising at least two duplicates of the original ASCII character, including a first duplicate ASCII character and a second duplicate ASCII character, where the first duplicate ASCII character and the second duplicate ASCII character are each based on the original ASCII character;
storing the proxy character on a data storage medium wherein the data storage medium has a decayable bit logical value where the decayable bit logical value may decay to another logical value over time;

receiving, from a user, a request to retrieve the original ASCII character;

in response to receiving the request to retrieve the original ASCII character:

producing a new ASCII character, retrieving the proxy character from the data storage medium, comparing, bitwise, the first duplicate ASCII character with the second duplicate ASCII character, on condition a logical value of any bit position of the first duplicate ASCII character is not equal to the logical value of a corresponding bit position of the second duplicate ASCII character, assigning the decayable bit logical value to the corresponding bit position of the new ASCII character, on condition a logical value of any bit position of the first duplicate ASCII character has a common logical value with a corresponding bit position of the second duplicate ASCII character, assigning the common logical value to the corresponding bit position of the new ASCII character; and returning the new ASCII character to the user.

10. The computer system of claim 9, wherein the proxy character is formulated to fall in an unassigned code point of a Unicode computing industry encoding standard.

11. The computer system of claim 9, wherein:

the original ASCII character does not provide for any error detection and/or error correction; and the proxy character uniquely identifies the original ASCII character and also provides for at least some error detection and/or error correction.

12. The computer system of claim 9, wherein the data storage medium is one of the following types of data storage media:

magnetic disk;

magnetic tape;

flash drive;

solid state drive; and optical disk.

\* \* \* \* \*